United States Patent
Lin et al.

(10) Patent No.: US 10,262,983 B2
(45) Date of Patent: *Apr. 16, 2019

(54) INTEGRATED PHOTO DETECTOR, METHOD OF MAKING THE SAME

(71) Applicant: INPHI CORPORATION, Santa Clara, CA (US)

(72) Inventors: Jie Lin, Santa Clara, CA (US); Masaki Kato, Palo Alto, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/979,046

(22) Filed: May 14, 2018

(65) Prior Publication Data

US 2018/0261591 A1    Sep. 13, 2018

Related U.S. Application Data

(63) Continuation of application No. 15/637,889, filed on Jun. 29, 2017, now Pat. No. 9,997,508, which is a
(Continued)

(51) Int. Cl.
*G02B 6/12* (2006.01)
*H01L 27/02* (2006.01)
(Continued)

(52) U.S. Cl.
CPC ............ *H01L 27/0248* (2013.01); *G02B 6/12* (2013.01); *G02B 6/12004* (2013.01); *G02B 6/4275* (2013.01); *H01L 27/1443* (2013.01); *H01L 31/02005* (2013.01); *H01L 31/028* (2013.01); *H01L 31/02019* (2013.01);
(Continued)

(58) Field of Classification Search
CPC ............ H01L 27/0248; H01L 31/028; H01L 31/02327; H01L 31/02005; H01L 31/103; H01L 31/1804; H01L 27/1443; H01L 31/02019; H01L 31/022408; G02B 6/12;
(Continued)

(56) References Cited

U.S. PATENT DOCUMENTS 9,806,112 B1 * 10/2017 Celo ................... H01L 27/1443

* cited by examiner

*Primary Examiner* — Ellen E Kim
(74) *Attorney, Agent, or Firm* — Richard T. Ogawa; Ogawa P.C.

(57) ABSTRACT

An integrated photo detector with enhanced electrostatic discharge damage (ESD) protection. The integrated photo detector includes a first photodiode formed in the SOI substrate and associated with a first p-electrode and a first n-electrode. Additionally, the integrated photo detector includes a second photodiode formed in the SOI substrate associated with a second p-electrode and a second n-electrode forming a capacitance no larger than a few femto Faradays. Moreover, the integrated photo detector includes a first electrode and a second electrode disposed respectively on the SOI substrate. The first/second electrode is respectively connected to the first p/n-electrode via a first/second metallic layer patterned with a reduced width from the first/second electrode to the first p/n-electrode and connected to the second p/n-electrode via a first/second metallic wire to make a parallel coupling between the first photodiode and the second photodiode with an ESD threshold of about 100V.

21 Claims, 4 Drawing Sheets

Related U.S. Application Data continuation of application No. 15/208,547, filed on Jul. 12, 2016, now Pat. No. 9,726,841.

(51) Int. Cl.
*G02B 6/42* (2006.01)
*H01L 31/02* (2006.01)
*H01L 31/0224* (2006.01)
*H01L 27/144* (2006.01)
*H01L 31/0232* (2014.01)
*H01L 31/028* (2006.01)
*H01L 31/103* (2006.01)
*H01L 31/18* (2006.01)

(52) U.S. Cl.
CPC .......... *H01L 31/02327* (2013.01); *H01L 31/022408* (2013.01); *H01L 31/103* (2013.01); *H01L 31/1804* (2013.01); *G02B 2006/12123* (2013.01)

(58) Field of Classification Search
CPC .............. G02B 6/12004; G02B 6/4275; G02B 2006/12123
See application file for complete search history.

INTEGRATED PHOTO DETECTOR, METHOD OF MAKING THE SAME

CROSS-REFERENCE TO RELATED APPLICATIONS

This application is continuation of and claims priority to U.S. patent application Ser. No. 15/637,889 filed Jun. 29, 2017, which is a continuation of U.S. patent application Ser. No. 15/208,547 filed on Jul. 12, 2016, now U.S. Pat. No. 9,726,841 issued Aug. 8, 2017, commonly assigned and incorporated by reference herein for all purposes.

BACKGROUND OF THE INVENTION

The present invention relates to a high-speed optic-electric telecommunication device. More particularly, the present invention provides an integrated photo detector with improved electrostatic discharge damage threshold and a method of making the same.

Over the last few decades, the use of broadband communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

As science and technology are updated rapidly, processing speed and capacity of the computer increase correspondingly. The communication transmission or reception using the traditional cable is limited to bandwidth and transmission speed of the traditional cable and mass information transmission required in modern life causes the traditional communication replaces the traditional communication transmission system gradually for systems requiring higher bandwidth and longer distance that electrical cable cannot accommodate. With the advances of optical communication technology and applications driven by the market demand on increasing bandwidth and decreasing package footprint, more intensive effort and progress have been seen in the development of silicon photonics on integrating electro-photonic circuits on silicon-on-insulator (SOI) substrate for forming high-speed high-data-rate broadband optic-electric telecommunication devices.

In these broadband optical telecommunication devices based on silicon photonics technology, Ge photodiode is commonly used as a photon detector for monitoring high-speed optical signal transmission since it can be integrated onto silicon or SOI substrate monolithically. However, high-speed Ge photodiode is vulnerable to electrostatic discharge damage (ESD). Because of its low ESD threshold, many silicon photonics communication modules having Ge photo detectors suffered low assembly yield. On the other hand, traditional ESD protection techniques including schemes of using steering-diode arrays, transient-voltage-suppressor (TVS) diodes, and Zener diodes by external chips are mostly geared for electronics module only but not for handling photo detection so as to not suit for being implemented into the silicon photonics devices. FIG. 1 shows examples of conventional ESD protection circuit diagrams with Zener diodes. Each Zener diode (or a Zener diode pair) is used as an external chip for connecting in parallel (either in phase or out of phase) with a subject high-speed Ge photodiode (Ge PD). The Zener diode requires highly doped base region and is not regularly formed in a same process for forming the Ge PD on the SOI substrate for high-speed optic-electric communication applications. Typically, for providing ESD protection purpose, the Zener diode chip is formed separately and mounted or connected to a photodiode chip by solder bump or wire bonding, making the silicon photonics integration level much lower and vulnerable to reliability and assembly yield issue.

Therefore, it is desired to develop improved photodiode devices/circuits with improved ESD threshold for the integrated silicon photonics devices.

BRIEF SUMMARY OF THE INVENTION

The present invention relates to a high-speed optic-electric telecommunication device. More particularly, the present invention provides an integrated photo detector with improved electrostatic discharge damage threshold and a method of making the same. Merely by example, the present invention discloses an integrated photodiode circuit and a method for forming the same by coupling a Si photodiode with a Ge photodiode in parallel with both being fabricated on a same SOI substrate to provide high ESD threshold intrinsic to Si photodiode while maintaining high data rate in electrical signal converted by the Ge photodiode, though other applications are possible.

In a specific embodiment, the present invention provides an integrated photo detector with enhanced electrostatic discharge damage (ESD) protection. The integrated photo detector includes an input waveguide formed in a Si-on-insulator (SOI) substrate for receiving a light wave. The integrated photo detector additionally includes a first photodiode formed in the SOI substrate and coupled to the input waveguide. The first photodiode is associated with a first p-electrode and a first n-electrode. Furthermore, the integrated photo detector includes a second photodiode formed in the SOI substrate associated with a second p-electrode and a second n-electrode forming a capacitance no larger than a few femto Faradays. Moreover, the integrated photo detector includes a first electrode and a second electrode disposed respectively on the SOI substrate. The first/second electrode is respectively connected to the first p/n-electrode via a first/second metallic layer patterned with a reduced width from the first/second electrode to the first p/n-electrode and connected to the second p/n-electrode via a first/second metallic wire.

In another specific embodiment, the present invention provides an integrated photo detector with enhanced electrostatic discharge damage (ESD) protection. The integrated photo detector includes a Germanium photodiode comprising an intrinsic Germanium layer formed on a p-type Silicon base layer patterned within a Si-on-Insulator (SOI) substrate. The intrinsic Germanium layer includes a first n++ doped region and the p-type Silicon base layer comprising a first p++ doped region. Additionally, the integrated photo detector includes a Silicon photodiode comprising a Silicon region patterned within the SOI substrate to form a p-type Silicon portion joined with a n-type Silicon portion. The p-type Silicon portion includes a second p++ doped region and the n-type Silicon portion comprising a second n++ doped region. Furthermore, the integrated photo detector includes a first metallic layer being pattered to include a first p-electrode coupled to the first p++ doped region, a second p-electrode coupled to the second p++ doped region, a first electrode connected to the first p-electrode by a portion of the first metallic layer with a reducing width and connected to the second p-electrode by a first trace line. Moreover, the integrated photo detector includes a second metallic layer being patterned to include a first n-electrode coupled to the first n++ doped region, a second n-electrode coupled to the second n++ doped region, a second electrode connected to the first n-electrode by a portion of the second metallic layer with a reducing width and connected to the second n-electrode by a second trace line. The Silicon photodiode is coupled with the Germanium photodiode electrically in parallel with a capacitance of no greater than a few femto Faradays and an enhanced ESD threshold of about ±100V.

In another alternative embodiment, the present invention provides a method for manufacturing an integrated photo detector with improved electrostatic discharge damage (ESD) protection. The method includes forming a first Silicon base block and a second Silicon base block on a substrate. The method further includes forming a Germanium photodiode partially in the first Silicon base block. The Germanium photodiode is associated with a first p-electrode and a first n-electrode. Additionally, the method includes forming a Silicon photodiode in the second Silicon bask block. The Silicon photodiode is associated with a second p-electrode and a second n-electrode. The second p-electrode and the second n-electrode serve as two terminals of a capacitance no larger than a few femto Faradays. The method further includes forming a first electrode and a second electrode separately on the substrate. Furthermore, the method includes forming a first metallic layer on the substrate. The first metallic layer is patterned to have a first portion with a reducing width connecting the first electrode to the first p-electrode and a second portion with a first trace line connecting the first electrode to the second p-electrode. Moreover, the method includes forming a second metallic layer on the substrate. The second metallic layer is patterned to have a third portion with a reducing width to connect the second electrode to the first n-electrode and a fourth portion with a second trace line to connect the second electrode to the second n-electrode.

Many benefits can be achieved with the present invention based on integrating Ge PD with a Si PD in parallel on the same substrate. The higher ESD threshold of the added Si PD helps to improve the ESD protection capability of the integrated photodiode. The small capacitance introduced by the added Si PD, which is in a few femto Faradays range and is several orders of magnitudes lower than that of a conventional Zener diode for ESD protection, the enhanced ESD protection by the added Si PD causes no impact on the high-speed performance of Ge PD. Additionally, Si-based and Ge-based PN junction photo diode can be easily fabricated on SOI substrate in a unified process to form various integrated silicon photonics circuits.

The present invention achieves these benefits and others in the context of known integrated silicon photonics devices. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to a high-speed optic-electric telecommunication device. More particularly, the present invention provides an integrated photo detector with improved electrostatic discharge damage threshold and a method of making the same. Merely by example, the present invention discloses an integrated photo detector and a method for forming the same by coupling a Si photodiode with a Ge photodiode in parallel fabricated on a same SOI substrate with an ESD threshold of about 100V for high-speed data communication, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 1:
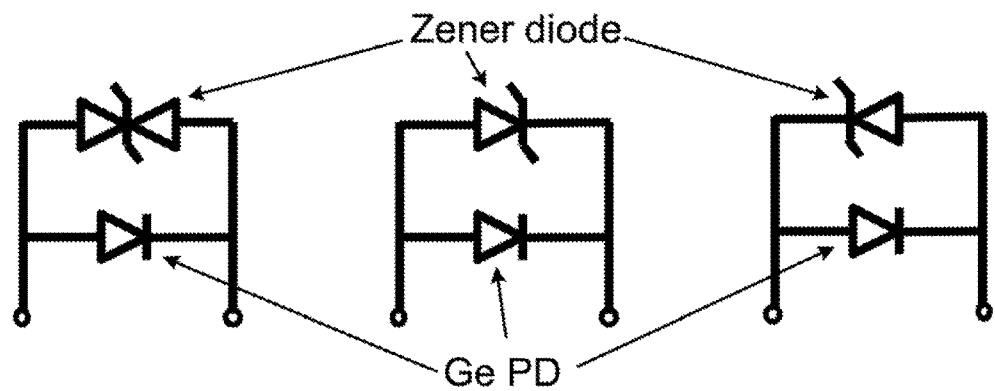
FIG. 1 shows examples of conventional ESD protection circuit diagrams with Zener diodes.
Figure 2:
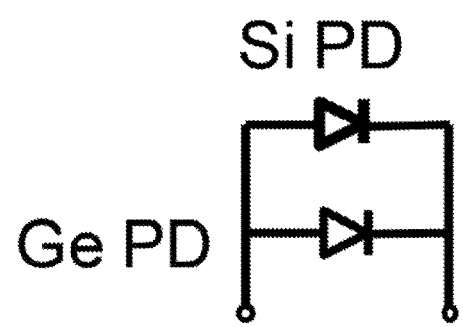
FIG. 2 is a simplified ESD protection circuit diagram according to an embodiment of the present invention.

FIG. 2 is a simplified ESD protection circuit diagram according to an embodiment of the present invention. This diagram is merely an example, which should not unduly limit the scope of the claims. One of ordinary skill in the art would recognize many variations, alternatives, and modifications. As shown, a Silicon photodiode (Si PD) is electrically connected with a Germanium photodiode (Ge PD) in parallel to form an integrated photo detector with improved Electrostatic Discharge Damage (ESD) protection. In particular, the Si PD is connected the same phase with the Ge PD, i.e., the p-nodes (or p-doped regions) of both the Si PD and the Ge PD are connected to one common node. The n-nodes (or n-doped regions) of them are connected to another common node. Si PD inherently has much lower dark current and much higher ESD threshold than Ge PD. Therefore, connection of Si PD with Ge PD in parallel will not impact Ge PD's leakage performance. The leakage performance is still limited to the Ge PF within the integrated photo detector. Additionally, the Si PD adds just tiny capacitance in ~fF level to the integrated photo detector. This ultra small extra capacitance does not impact high speed performance of Ge PD as the integrated photo detector is implemented into the silicon photonics integrated circuit for high-speed communication applications.

Figure 3:
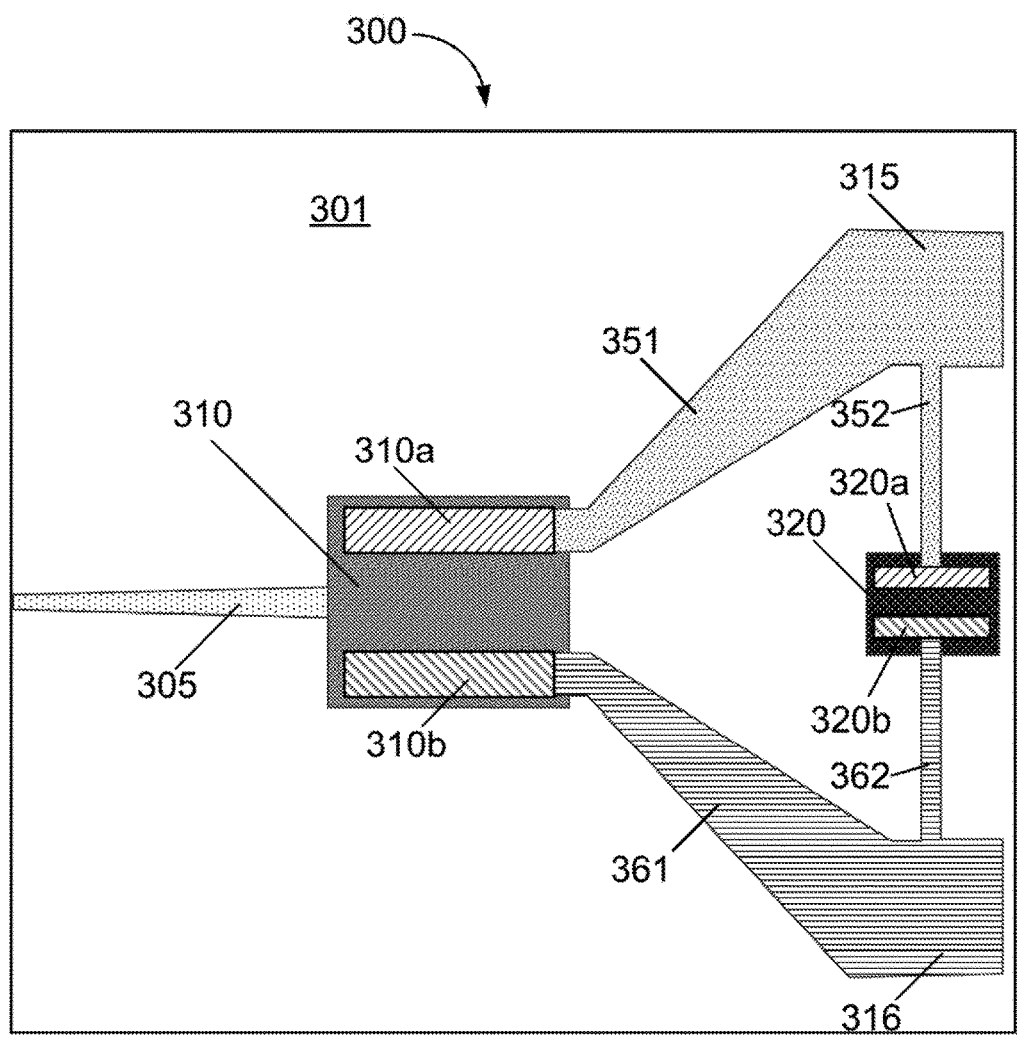
FIG. 3 is a simplified diagram of an integrated photo detector having both Si PD and Ge PD fabricated on a same substrate according to an embodiment of the present invention.

In an embodiment, the Si PD and the Ge PD are fabricated on the same substrate. For specific applications in silicon photonics devices, silicon-on-insulator (SOI) substrate is a preferred choice of the substrate. Si photodiode is a natural component on silicon photonics circuit. Ge is similar to Si, though there is slight lattice mismatch. Ge PD has advantages in high-speed performance and can be formed by a process similar to the silicon process. Therefore, Ge PD becomes a leading candidate for integrating with a Si PD to form a high speed integrated photo detector. FIG. 3 is a simplified diagram of an integrated photo detector having both Si PD and Ge PD fabricated on a same substrate according to an embodiment of the present invention. This diagram is merely an example, which should not unduly limit the scope of the claims. One of ordinary skill in the art would recognize many variations, alternatives, and modifications. As shown, a high-speed integrated photo detector 300 is fabricated on a substrate 301 by integrating a high-speed Ge PD 310 with a Si PD 320 electrically in parallel. In particular, the Ge PD 310 includes a PN junction and has a first p-electrode 310a coupled to a p-type doped region of the Ge PD 310 and a second n-electrode 310b coupled to an n-type doped region of the Ge PD 310. Similarly, the Si PD 320 also has a second p-electrode 320a coupled to a p-type doped region of the Si PD 320 and a second n-electrode 320b coupled to an n-type doped region of the Si PD 320. Both the first p-electrode 310a and the first n-electrode 310b serve as two terminals of a first capacitor associated with the Ge PD 310. Both the second p-electrode 320a and the second n-electrode 320b serve as two terminals of a second capacitor associated with the Si PD 320. The sizes of the second p-electrode 320a and the second n-electrode 320b are make small relative to those of the first p-electrode 310a and the first n-electrode 310b to keep capacitance of the second capacitor small. In a specific embodiment, the capacitance of the second capacitor associated with the Si PD 320 is kept no more than a few femto Faradays. This is to minimize its impact on the photo detection by the Ge PD 310.

In some embodiments, the integrated photo detector 300 includes a first electrode 315 and a second electrode 316, respectively disposed on the substrate 301 on two separate locations. In an embodiment, the first electrode 315 and the second electrode 316 are formed with a relative large size with a dimension of a few 10s and 100s micrometers sufficient for forming a solder bump for bounding wires to connect with an external electronic circuit (for telecommunication). In another embodiment, the first electrode 315 serves as a cathode and the second electrode 316 serves as an anode, for outputting electric signals converted from optical signals carried by a light wave detected by the Ge PD 310. Optionally, the light wave is pre-modulated with a high data rate (such as 40 Gbit/s) and correspondingly the Ge PD 310 is able to detect the optical signal with high speed and convert to an electric signal that maintains the high data rate. In yet another embodiment, the first electrode 315 is physically connected to the first p-electrode 310a and the second p-electrode 320a, the second electrode 316 is physically connected to the first n-electrode 310b and the second n-electrode 320b, for coupling the Si PD 320 to the Ge PD 310 electrically in parallel for enhancing Electrostatic Discharge Damage protection.

In an embodiment, the integrated photo detector includes an input waveguide 305 fabricated in the same substrate 301. The Ge PD 310 is directly coupled with the input waveguide 305 for receiving the light wave that carries high data rate optical signals. This input waveguide 305 can be made by one material of Silicon, Germanium, Silicon Nitride, or other Silicon compound. The input waveguide 305, of course, is able to connect with a light source, a modulator, and optionally a multiplexer/demultiplexer or other optical network components in an opto-electric communication system. It is merely an example of an opto-electronic device using a Ge PD for monitoring or measuring optical power associated with a plurality of silicon photonics circuits for high-speed telecommunication applications.

In some other embodiments, part or all of the first electrode 315, first p-electrode 310a, second p-electrode 320a are formed by a single process of forming a metallic layer overlying the substrate 301 including the Ge PD 310 and the Si PD 320 and patterning it to separate electrodes. Alternatively, part or all of the first electrode 316, first n-electrode 310b, second n-electrode 320b are formed by a single process of forming a metallic layer overlying the substrate 301 including the Ge PD 310 and the Si PD 320 and patterning it to separate electrodes. In an embodiment, all those electrodes are formed by a single metalization process that includes optionally patterning, masking, depositing, or etching a certain thickness of a metalic layer overlying partially the substrate 301, the Ge PD 310, and the Si PD 320. The metallic layer can be used commonly from copper, aluminum, tin, lead, or other good conductor material such as conductive oxides.

Referring to FIG. 3, a first metallic layer mentioned in last section can be patterned to have a first portion 351 configured with reducing width to connect the first electrode 315 to the first p-electrode 310a and a second portion 352 configured as a thin trace line to connect the first electrode 315 to the second p-electrode 320a. Similarly, a second metallic layer is patterned to have a third portion 361 configured with reducing width to connect the second electrode 316 to the first n-electrode 310b and have a fourth portion 362 configured as a thin trace line to connect the second electrode 316 to the second n-electrode 320b.

The thin trace line 352/362 is part of the first/second metallic layer sufficient for make the electrical conduction between the first/second electrode to the second p/n-electrode 320a/320b of the Si PD 320 but made with a width as small as a few micrometers or less so that it contributes negligible capacitance to the Si PD 320. Overall, provided with a small size for each of the second p/n-electrode 320a/320b and a small Si PD base block combining p-type doped region and n-type doped region, the Si PD 320 adds an ultra small (e.g., a few femto Faradays) capacitance to the integrated photo detector 300. This ultra small capacitance causes substantially no impact on the high-speed photon detection involved with the Ge PD 310. While in the conventional approach of using Zener diode for ESD protection, the capacitance of Zener is several order of magnitudes larger in pico Faradays range. That is at least one reason why Zener diode is not suitable for supporting high-speed optical telecommunication applications.

Figure 4:
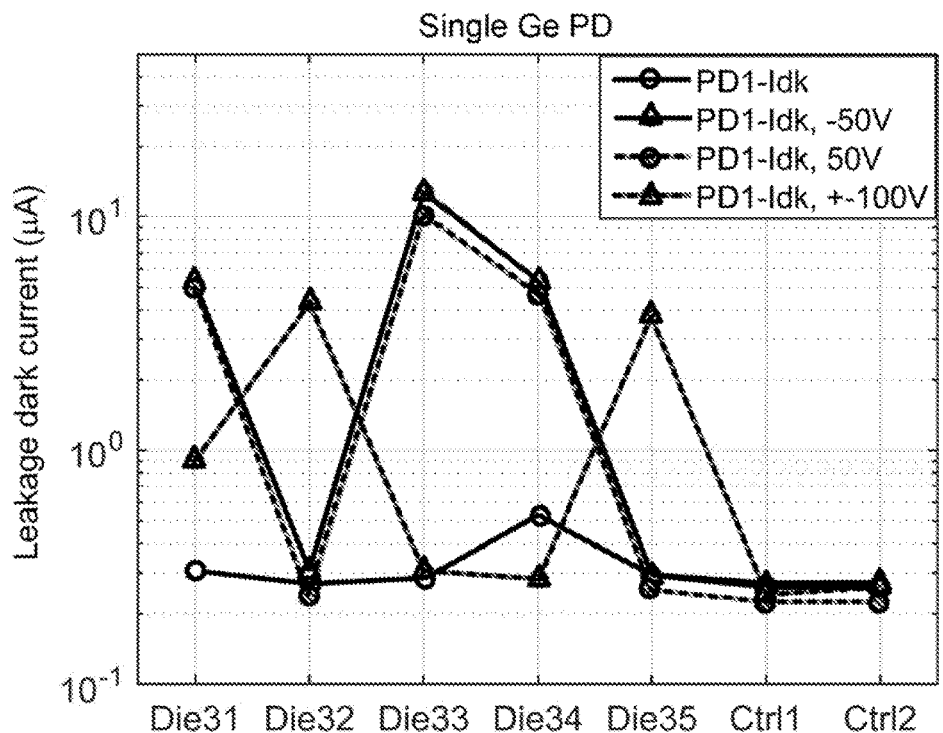
FIG. 4 shows Human Body Model ESD test results of multiple samples with a single Ge PD only.

For any semiconductor devices with ESD protection circuitry, it is required to ensure their effectiveness and reliability to meet industrial standards. Various kinds ESD test schemes are selected to perform and qualify the circuitry. For example, a human-body-model (HBM) scheme simulates ESD due to discharge from human beings. People are considered a principal source of ESD, and HBM is a commonly used model to describe an ESD event. FIG. 4 shows HBM ESD test results of multiple samples with a single Ge PD only. As shown, diode leakage dark current data collected for total seven samples with single Ge PD are plotted. Two of the seven samples are held as control samples under a fixed ESD-free condition. Rest five samples are subjected to different ESD test conditions including −50V test voltage, +50V test voltage, and ±100V test voltages. It is shown that almost all samples show at least 10 times increase in leakage dark current after −50V and +50V ESD test, setting a basis for demanding an improved high-speed photodiode with improved ESD protection performance. A rough estimate of the ESD threshold for the single Ge PD is barely ±50V (at least under HBM ESD test scheme).

Figure 5:
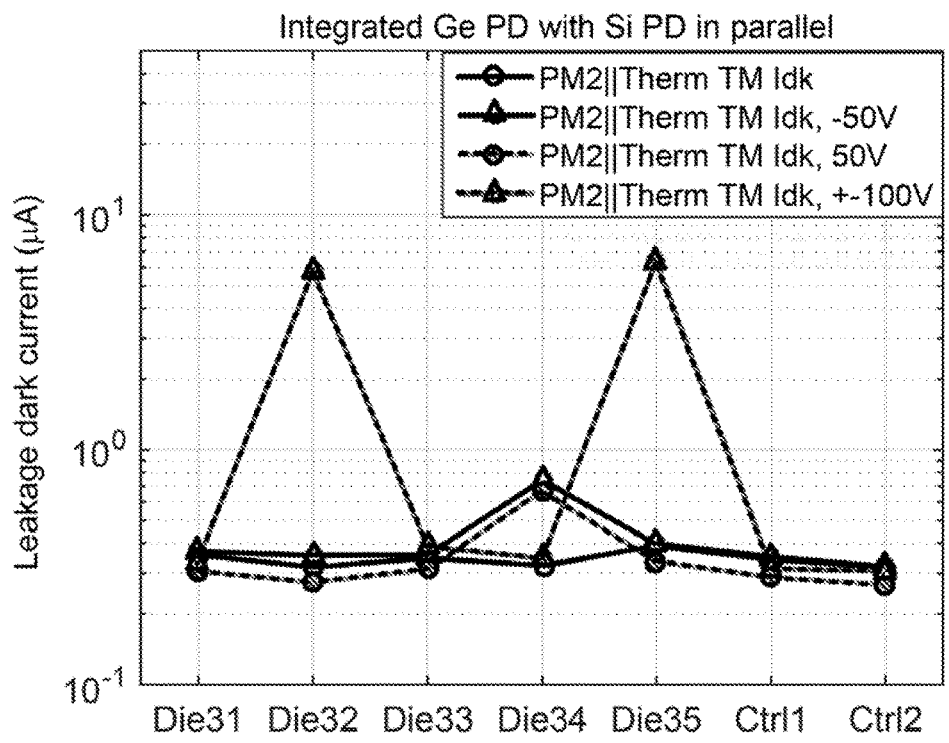
FIG. 5 shows Human Body Model ESD test results of multiple samples with a Ge PD being integrated in parallel with a Si PD according to an embodiment of the present invention.

FIG. 5 shows HBM ESD test results of multiple samples with a Ge PD being integrated in parallel with a Si PD according to an embodiment of the present invention. This diagram is merely an example, which should not unduly limit the scope of the claims. One of ordinary skill in the art would recognize many variations, alternatives, and modifications. As shown, diode leakage dark current data collected for total seven samples with Ge PD integrated with Si PD in parallel (see FIG. 2 and FIG. 3) are provided. Two of the seven samples are held as control samples under a fixed ESD-free condition. Five other samples are tested and measured the corresponding leakage dark current under −50V, +50V, and ±100V ESD test voltages. The data in FIG. 5 indicate that the leakage dark current substantially stays in the same level after carrying out −50V and +50V ESD tests due to enhanced protection introduced by the Si PD in the integrated photodiode 300 (see FIG. 3). Only after the ESD test voltage increases to ±100V should one see significant increase in the leakage dark current passing the integrated photodiode. A rough estimate of the ESD threshold is about ±100V for the integrated photodiode having a Ge PD connected to a Si PD in parallel, which improves by 2 times over that for single Ge PD.

Figure 6A:
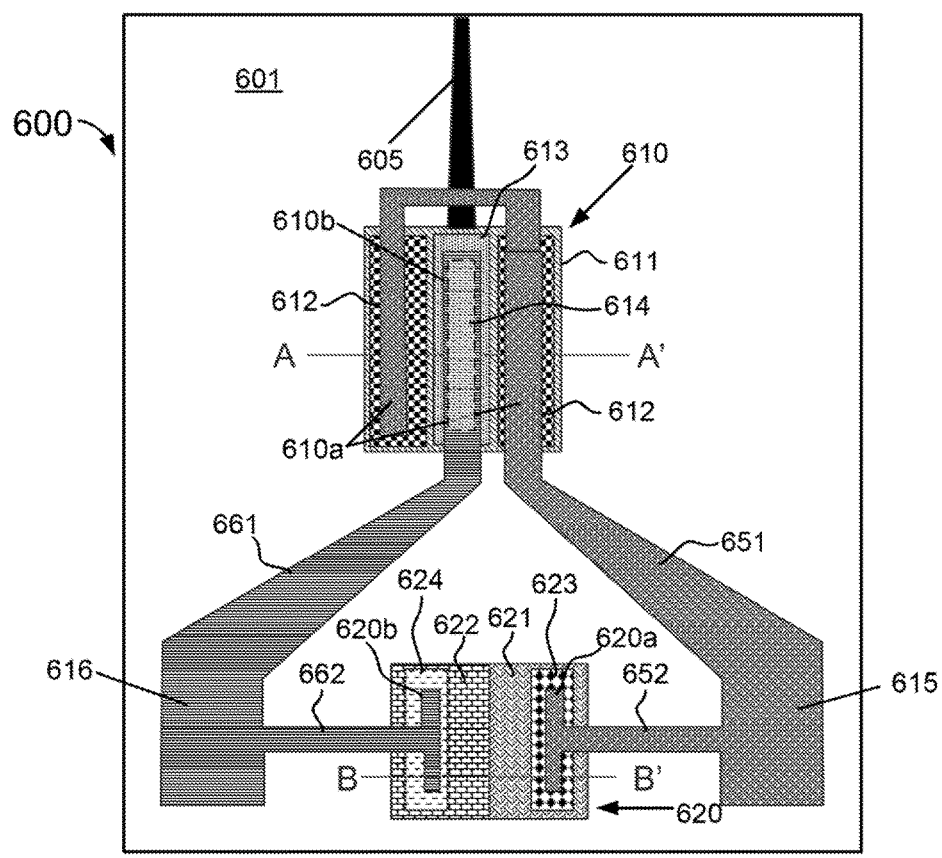
FIG. 6A is a simplified diagram of an integrated photo detector having both Si PD and Ge PD fabricated on a same substrate according to another embodiment of the present invention.

FIG. 6A is a simplified diagram of an integrated photo detector having both Si PD and Ge PD fabricated on a same substrate according to another embodiment of the present invention. As shown, a Ge PD 610 and a Si PD 620 are fabricated on a single substrate 601. The substrate 601 is a Si-on-insulator (SOI) substrate having a silicon layer over a BOX insulator layer on a silicon wafer substrate. Referring to FIG. 6A, the Ge PD 610 includes a silicon base block 611 formed by patterning the silicon layer of the SOI substrate 601 into a finite dimension. A doping process can be performed to make the silicon base block 611 a p-type doping characteristics. The doping process can be performed using an implant mask to dope the above region only. On the silicon base block 611, a Germanium layer 613 can be formed by depositing intrinsic Ge substantially free of doping impurities. Although there is a lattice mismatch between Ge and Si, a certain thickness of strained Ge layer can be formed. Optionally, Ge—Si alloy may be formed during the process.

Figure 6B:
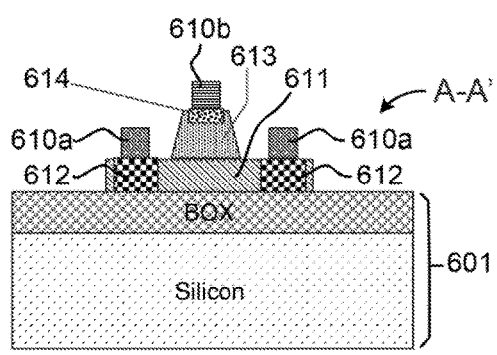
FIG. 6B is a sectional view along AA' across the Ge PD in FIG. 6A.

In some embodiments, on the silicon base block 611, a doping process can be carried to form a p++ doped region 612 in part of the silicon base block 611. Optionally, the p++ doped region 612 is formed on one part of the silicon base block 611. Optionally, the p++ doped region 612 is formed on two parts of the silicon base block 611 separated by the intrinsic Ge layer 613. Further, another doping process can be carried to form a n++ doped region 614 within the intrinsic Ge layer 613. All the doping processes can be performed by using masked implantations with corresponding p and n-type impurities. The depth of the p++ doped region 612 can be as deep as the whole thickness of the silicon base block 611. The depth of the n++ doped region 614 is controlled to be less than total thickness of the intrinsic Ge layer 613. As a result, a PIN junction is formed as a core structure of the Ge PD 610 with a p-node at the p++ doped region 612 in the silicon base block 611, an intrinsic region at the intrinsic Ge layer 613, and an n-node at the n++ doped region 614. Furthermore, a p-electrode 610a can be formed overlying at least partial top of the p-node of the PIN junction and an n-electrode 610b can be formed on top of the n-node of the PIN junction. The structure of the Ge PD 610 is further illustrated in FIG. 6B in a cross sectional view along a cut line AA' of FIG. 6A.

Figure 6C:
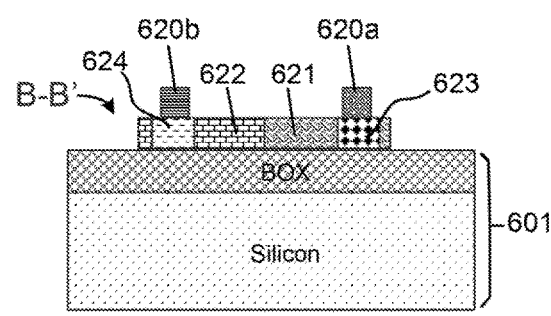
FIG. 6C is a sectional view along BB' across the Si PD of FIG. 6A.

Referring to FIG. 6A again, the Si PD 620 is also formed by patterning the original silicon layer of the SOI substrate 601 to a finite size and performing masked implantation to obtain a base block containing a p-type doped region 621 joined with a n-type doped region 622. Optionally, the bask block for the Si PD 620 is made smaller relative to the silicon base block 611 for the Ge PD 610. Optionally, another doping process can be performed using masked implantation to form a p++ doped region 623 within the p-type doped region 621 and separately form an n++ doped region 624 within the n-type doped region 622. As a result, a PN junction is formed as a core structure for the Si PD 620 with a p-node at the p++ doped region 623 and an n-node at the n++ doped region 624. Furthermore, a p-electrode 620a can be formed overlying at least partial top of the p-node of the PN junction and an n-electrode 620b can be formed on top of the n-node of the PN junction. The structure of the Si PD 620 is further illustrated in FIG. 6C in a cross sectional view along a cut line BB' of FIG. 6A.

In an alternative embodiment, a method for manufacturing an integrated photo detector with enhanced electrostatic discharge damage (ESD) protection is provided and specifically shown below by referring to FIG. 3 and FIGS. 6A, 6B, and 6C. The method includes forming a Germanium photodiode on a substrate, for example, on a Silicon wafer substrate or a silicon-on-insulator (SOI) substrate. SOI substrate is often used for forming integrated opto-electronics devices including photodiodes, planar waveguides, metallic electrodes, etc. The Germanium photodiode, as processed via a series of patterning, doping, depositing, masking, implanting, or etching steps within the SOI substrate, is configured to be a PIN junction device associated with a first p-electrode separated with a first n-electrode by an intrinsic region.

Additionally, the method includes forming a Silicon photodiode on the same substrate. The Silicon photodiode is configured, under a substantially similar patterning, masking, implanting, or etching process together with the formation of the Germanium photodiode over the SOI substrate, to be a PN junction device associated with a second p-electrode and a second n-electrode. Both the second p-electrode and the second n-electrode are made substantially smaller than the first p-electrode and the first n-electrode to provide an ultra small capacitance in a few femto Faradays so that its impact on the Ge photodiode is minimized.

Furthermore, the method includes forming a first electrode and a second electrode separately on the SOI substrate respectively at two separate locations away from the Ge PD and the Si PD. Optionally, the first electrode and the second electrode are made relatively larger than the p-electrode or n-electrode in either the Ge PD or Si PD. In an example, the first electrode and the second electrode has a lateral dimension of a few tens or hundreds of micrometers. This size is sufficiently large for forming solder bump for making conductive wire connection. Moreover, the method is using a first metallic layer patterned to have a first portion with reducing width to connect the first electrode to the first p-electrode in the Ge PD and a second portion with a thin trace line to connect the first electrode to the second p-electrode in the Si PD. Similarly, the method is using a second metallic layer patterned to have a third portion with reducing width to connect the second electrode to the first n-electrode in the Ge PD and a fourth portion with a thin trace line to connect the second electrode to the second n-electrode in the Si PD.

Optionally, the first metallic layer and the second metallic layer is a same metal layer formed on the SOI substrate (including the as-formed Ge PD and Si PD) then patterned to have corresponding portions for connecting respective electrodes. Optionally, the thin trace line is made substantially small width of a few micrometers or less to minimizing its contribution to the ultra-small capacitance associated with the Si PD. These connections cause the Si PD to be coupled to the Ge PD electrically in parallel, i.e., the first p-electrode of the Ge PD is connected to the second p-electrode of the Si PD and the first n-electrode of the Ge PD is connected to the second n-electrode of the Si PD. The parallel connection of Si PD to the Ge PD provides an enhanced ESD protection to the integrated photo detector as the Si PD possesses a higher ESD threshold inherently. At the same time, the Si PD has lower dark current so as not to impact the Ge PD leakage performance. The ultra-small capacitance of the Si PD keeps the high-speed performance of the Ge PD for converting light wave to electrical signal.

Optionally, the PIN junction of the Ge PD includes a first Si base block formed in the silicon layer of the SOI substrate. The first Si base block can be formed by masking and etching from the silicon layer to a finite lateral dimension depending on the design of the Ge PD. The first Si base block is further doped to have a p-type characteristic by implanting a p-type impurity into the block. Furthermore, the PIN junction includes an intrinsic Ge layer formed on a partial top portion of the (p-type) first Si base block by masking and depositing up to a certain thickness with strain due to slight lattice mismatch between Si and Ge. Moreover, the PIN junction includes additional doping process to form a first p++ doped region within the p-type Si base block and a first n++ doped region within the intrinsic Ge layer. Optionally, the doping process is performed using masked implantation. Optionally, a depth of the first p++ doped region is not specifically limited but can be extended to a total thickness of the p-type Si base block. But, a depth of the first n++ doped region is limited to only partial thickness of the intrinsic Ge layer leaving a finite gap of the intrinsic Ge material above the p-type Si base block. Optionally, the first p++ doped region can be formed on two sides of the p-type first Si base block separated by the partial portion covered by the intrinsic Ge layer. Optionally, the first p++ doped region is formed on a single portion of the first Si base block.

Optionally, the first p-electrode is formed to directly couple with the first p++ doped region(s) of the PIN junction of the Ge PD and the first n-electrode is formed to directly couple with the first n++ doped region.

Optionally, the PN junction of the Si PD includes a second Si base block formed similarly in the SOI substrate by patterning, etching or other processes to have a finite lateral dimension that is smaller than the first Si base block. The second Si base block is separated from the first Si base block. Further the second Si base block is performed a doping process to have a p-type portion joined with an n-type portion. Furthermore, the PN junction is formed by performing another doping process to implant more p-type impurity into a partial region of the p-type portion to form a second p++ doped region and implant more n-type impurities into a partial region of the n-type portion to form a second n++ doped region. Optionally, a depth of the second p++ doped region or the second n++ doped region is not specifically limited but can be extended to a total thickness of the second Si base block.

Optionally, the second p-electrode is formed to directly couple with the second p++ doped region(s) of the PIN junction of the Ge PD and the second n-electrode is formed to directly couple with the second n++ doped region.

Optionally, the method includes forming an input waveguide coupled to the Ge PD for receiving a light wave that carries an optical signal modulated with high data rate. The high-speed performance of the Ge PD is capable to convert these optical signals to electric signals that maintain the high data rate. The electric signals are outputted via the first electrode (as a cathode) and the second electrode (as an anode) to the external electric circuit associated with a high-speed opto-electric communication network.

Optionally, the first/second metallic layer is formed by patterning a single layer of metallic material, including typical conductor material selected from copper, aluminum, tin, lead or others used in silicon photonics devices. The patterning process leads to the formation of the first/second middle section out of a natural portion of the first/second metallic layer in a shape with a reducing width from the second node region with the expanded width to the first node region (of a smaller width). Similarly, the first/second trance line comprises a thin conductive line with a width of a few micrometers or less formed by patterning a natural portion out of the first/second metallic layer.

Optionally, the method includes configuring the size, distance, and location of the third node region and sixth node region plus the second intrinsic region in combination to effectively provide a capacitor with a capacitance value limited no greater than a few femto Faradays. The small size of cathode and anode of the Silicon photodiode and thin first/second trace lines for connecting with external current/voltage source are limiting factors of such small capacitance which is essential for not impacting the high-speed optical telecommunication designated for the Germanium photodiode.

Optionally, the method includes configuring the doping level of the second p-doped region and a second n-doped region and the size of the second intrinsic region to yield an ESD threshold of about ±100V associated with the Silicon photodiode. This almost increases the ESD threshold by 2 times over the Germanium photodiode alone, providing enhanced ESD protection.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An electro-optic telecommunication device, the device comprising:
    an integrated photo detector with an electrostatic discharge damage (ESD) protection comprising:
    an input waveguide formed in a Si-on-insulator (SOI) substrate for receiving a light wave;
    a first photodiode formed in the SOI substrate and coupled to the input waveguide, the first photodiode being associated with a first p-electrode and a first n-electrode;
    a second photodiode formed in the SOI substrate associated with a second p-electrode and a second n-electrode forming a capacitance no larger than a few femto Faradays;
    a first electrode and a second electrode disposed respectively on the SOI substrate, the first electrode being respectively connected to the first p-electrode and the second p-electrode, the second electrode being respectively connected to the first n-electrode and the second n-electrode; and
    a network coupled to the device.

2. The device of claim 1, wherein the first photodiode is a Germanium-based photodiode configured to detect the light wave modulated with a high data rate.

3. The device of claim 1, wherein the input waveguide comprise a material of silicon or germanium or silicon nitride formed in the SOI substrate for transmitting the light wave therein.

4. The device of claim 2, wherein the Germanium-based photodiode comprises a p-type Silicon base patterned within the SOI substrate and an intrinsic Germanium block formed overlying the p-type Silicon base, the p-type Silicon base being partially implanted via a first mask to form a first p++ doped region and the intrinsic Germanium block being partially implanted via a second mask to form a first n++ doped region.

5. The device of claim 4, wherein the first p-electrode is physically bounded onto the p++ doped region and the first n-electrode is physically bounded onto the n++ doped region.

6. The device of claim 1, wherein the second photodiode is a Silicon-based photodiode coupled to the Germanium-based photodiode to provide an electrostatic discharge damage threshold of ±100V or higher.

7. The device of claim 6, wherein the Silicon-based photodiode comprises a p-type Silicon region joined with an n-type Silicon region patterned within the SOI substrate, the p-type Silicon region being partially implanted via a third mask to form a second p++ doped region and the n-type Silicon region being partially implanted via a fourth mask to form a second n++ doped region.

8. The device of claim 1, wherein each of the second p-electrode and the second n-electrode is made substantially smaller in size than each of the first p-electrode and the first n-electrode.

9. The device of claim 2, wherein each of the first electrode and the second electrode is made substantially larger in size up to a few tens to hundreds of micrometers sufficient for forming a soldering connection with an external digital circuit for outputting an electric signal converted by the Germanium-based photodiode.

10. The device of claim 9 wherein the electric signal substantially maintains the high data rate of the light wave.

11. The device of claim 1, wherein each of the first p-electrode, the second p-electrode, the first n-electrode, the second n-electrode, the first electrode, and the second electrode is formed by patterning a single metallic layer including a first shaped section connected between the first p-electrode and the first electrode, a second shaped section connected between the first n-electrode and the second electrode, a first trace line connected between the second p-electrode and the first electrode, and a second trace line connected between the second n-electrode and the second electrode.

12. The device of claim 1, wherein the first/second trace line comprises a width of a few micrometers or less for minimizing the capacitance and yet maintaining electrical connection; the first/second shaped section comprises a reducing width from about hundreds of micrometers of the first/second electrode to a few micrometers of the first p/n-electrode.

13. An electro-optic telecommunication device, the device comprising:
    an integrated photo detector with an electrostatic discharge damage (ESD) protection comprising:
    a Germanium photodiode comprising an intrinsic Germanium layer formed on a p-type Silicon base layer patterned within a Si-on-Insulator (SOI) substrate, the intrinsic Germanium layer comprising a first n++ doped region and the p-type Silicon base layer comprising a first p++ doped region;
    a Silicon photodiode comprising a Silicon region patterned within the SOI substrate to form a p-type Silicon portion joined with a n-type Silicon portion, the p-type Silicon portion comprising a second p++ doped region and the n-type Silicon portion comprising a second n++ doped region;
    a first metallic layer being pattered to include a first p-electrode coupled to the first p++ doped region, a second p-electrode coupled to the second p++ doped region, a first electrode connected to the first p-electrode and the second p-electrode;
    a second metallic layer being pattered to include a first n-electrode coupled to the first n++ doped region, a second n-electrode coupled to the second n++ doped region, a second electrode connected to the first n-electrode and the second n-electrode;
    wherein the Silicon photodiode is coupled with the Germanium photodiode electrically in parallel with a capacitance of no greater than a few femto Faradays and an enhanced ESD threshold of about ±100V; and
    a network coupled to the device.

14. The device of claim 13 further comprising a first shaped metallic layer with a reducing width connected from the first electrode to the first p-electrode, a second shaped metallic layer with a reducing width connected from the second electrode to the first n-electrode, a first thin trace line of a few micrometers connected between the first electrode and the second p-electrode, and a second thin trace line of a few micrometers connected between the second electrode and the second n-electrode.

15. A method for manufacturing an integrated photo detector with an electrostatic discharge damage (ESD) protection, the method comprising:

forming a first Silicon base block and a second Silicon base block on a substrate;

forming a Germanium photodiode partially in the first Silicon base block, the Germanium photodiode being associated with a first p-electrode and a first n-electrode;

forming a Silicon photodiode in the second Silicon bask block, the Silicon photodiode being associated with a second p-electrode and a second n-electrode, the second p-electrode and the second n-electrode serving as two terminals of a capacitance no larger than a few femto Faradays;

forming a first electrode and a second electrode separately on the substrate;

forming a first metallic layer on the substrate to connect the first electrode respectively to the first p-electrode and the second p-electrode, the first metallic layer being patterned to have a first portion with a reducing width connecting the first electrode to the first p-electrode and a second portion with a first trace line connecting the first electrode to the second p-electrode;

forming a second metallic layer on the substrate to connect the second electrode respectively to the first n-electrode and the second n-electrode, the second metallic layer being patterned to have a third portion with a reducing width to connect the second electrode to the first n-electrode and a fourth portion with a second trace line to connect the second electrode to the second n-electrode; and coupling the device to a network.

16. The method of claim 15 wherein the first Silicon base block is a p-type Silicon layer and the second Silicon base block comprises a p-type Silicon portion joined with a n-type Silicon portion.

17. The method of claim 16 wherein forming the Germanium photodiode comprises depositing an intrinsic Germanium layer on the p-type Silicon layer of the first Silicon base block; implanting a first n++ doped region in the intrinsic Germanium layer by masked implantation; implanting a first p++ doped region in the p-type Silicon layer; coupling the first n++ doped region to the first n-electrode; and coupling the first p++ region to the first p-electrode.

18. The method of claim 16 wherein forming the Silicon photodiode comprises implanting a second p++ doped region in the p-type Silicon portion of the second Silicon base block; implanting a second n++ doped region in the n-type Silicon portion of the second Silicon base block; coupling the second p++ doped region to the second p-electrode; and coupling the second n++ doped region to the second n-electrode.

19. The method of claim 15 wherein forming a first metallic layer comprises patterning a first portion with a shape of reducing width from a few tens to hundreds micrometers at the first electrode to a few micrometers at the first p-electrode and a second portion of a thin trace line with a width of a few micrometers connected between the first electrode and the second p-electrode; forming a second metallic layer comprises patterning a third portion with a shape of reducing width from a few tens to hundreds micrometers at the second electrode to a few micrometers at the first n-electrode and a fourth portion of a thin trace line with a width of a few micrometers connected between the second electrode and the second n-electrode.

20. The method of claim 19 wherein the first/second metallic layer is configured to couple the Silicon photodiode to the Germanium photodiode electrically in parallel with a characterized ESD threshold of about ±100V.

21. The method of claim 15 wherein forming the first/second electrode comprises preparing for a formation of a solder bump for connecting with an external electronic circuit.

* * * * *